United States Patent [19]
Kemp

[11] Patent Number: 5,469,164
[45] Date of Patent: Nov. 21, 1995

[54] CIRCUIT AND METHOD FOR DIGITAL TO ANALOG SIGNAL CONVERSION

[75] Inventor: Christopher J. Kemp, Monument, Colo.

[73] Assignee: Ford Motor Company, Dearborn, Mich.

[21] Appl. No.: 129,899

[22] Filed: Sep. 30, 1993

[51] Int. Cl.⁶ ................................................... H03M 1/68
[52] U.S. Cl. .................................................. 341/145
[58] Field of Search .................................. 341/145, 150, 341/153, 154, 172

[56] References Cited

U.S. PATENT DOCUMENTS

| | | | |
|---|---|---|---|
| 4,077,035 | 2/1978 | Yee | 340/347 DA |
| 4,366,439 | 12/1982 | Yamakido | 329/104 |
| 4,384,276 | 5/1983 | Kelley et al. | 340/347 DA |
| 4,384,277 | 5/1983 | Allgood et al. | 340/347 DA |
| 4,388,612 | 6/1983 | Takagi et al. | 340/347 DA |
| 4,603,319 | 7/1986 | Hinn | 340/347 DA |
| 4,611,195 | 9/1986 | Shosaku | 341/145 |
| 4,618,847 | 10/1986 | Iida et al. | 341/145 |
| 4,665,380 | 5/1987 | Lewyn | 340/347 DA |
| 4,872,011 | 10/1989 | Pelgrom et al. | 341/150 |
| 4,873,525 | 10/1989 | Iida | 341/145 |
| 4,947,169 | 8/1990 | Smith et al. | 341/121 |
| 4,958,155 | 9/1990 | Gulczynski | 341/120 |
| 4,968,989 | 11/1990 | Olmstead et al. | 341/150 |
| 5,008,674 | 4/1991 | Da Franca et al. | 341/150 |
| 5,012,245 | 4/1991 | Scott et al. | 341/150 |
| 5,016,012 | 5/1991 | Scott et al. | 341/118 |
| 5,016,014 | 5/1991 | Bitting | 341/162 |
| 5,103,230 | 4/1992 | Kalthoff et al. | 341/166 |
| 5,162,801 | 11/1992 | Powell et al. | 341/150 |

*Primary Examiner*—Brian K. Young
*Attorney, Agent, or Firm*—Richard D. Dixon; Roger L. May

[57] ABSTRACT

A circuit (10') and method (50) for digital to analog (D/A) signal conversion. The circuit includes a voltage scaling D/A signal convertor segment (12'), a charge scaling D/A signal convertor segment (14'), and a switch (19) for switching a capacitive load (20') between the voltage and charge scaling D/A signal convertor segments (12',14'). The method includes converting (52,54,56) digital input signals to partial and final analog output signals, and applying (58) a partial analog output signal to the capacitive load (20') before applying (60) the final analog output signal to the capacitive load (20').

19 Claims, 3 Drawing Sheets

CIRCUIT AND METHOD FOR DIGITAL TO ANALOG SIGNAL CONVERSION

TECHNICAL FIELD

This invention relates generally to signal conversion. More specifically, this invention relates to a circuit and method for digital to analog signal conversion.

BACKGROUND ART

Digital equipment is now commonplace in most types of electrical applications. However, in many of these applications, analog signals remain necessary and are often preferred. Thus, with the proliferation of digital equipment, digital to analog (D/A) signal convertors have also gained widespread use. Such convertors can take a variety of forms.

One well known and very straightforward type of D/A signal convertor utilizes a voltage scaling approach. With voltage scaling architecture, an N-bit digital input signal is converted to an analog output signal by a series string of $2^N$ resistors connected between a reference voltage and ground sufficient to generate all of the required output voltages.

MOS transistors, preferable because they require virtually no input current and make excellent analog switches, are then used to switch the appropriate tap voltage to the output according to the applied digital input code. For a resistive load, voltage scaling D/A signal convertors also use an operational amplifier, configured as a voltage follower buffer, to provide a high impedance which prevents loading of the selected tap point. For a capacitive load, however, no such buffer is required. Moreover, voltage scaling D/A signal convertors are inherently monotonic.

Another well known type of D/A signal convertor utilizes a charge scaling approach. With charge scaling architecture, an N-bit digital input signal is converted to an analog output signal by a parallel array of $2^N$ binary weighted capacitors connected between a reference voltage and ground sufficient to generate all of the required output voltages. Such capacitors, if properly laid out, match quite well in MOS technology, making charge scaling a feasible approach.

Thus, in charge scaling D/A signal convertors, MOS transistors are once again used to switch the appropriate capacitors to the reference voltage or ground according to the applied digital input code, thereby producing the correct analog output voltage. In contrast to voltage scaling D/A signal convertors, charge-scaling D/A signal convertors always require an operational amplifier, configured as a voltage follower buffer, at the analog signal output, regardless of the type of load involved.

Voltage scaling and charge scaling D/A signal convertors, however, both suffer from a similar problem. More specifically, the size of either the resistor string or capacitor array can become prohibitive as the number of bits in the digital input code increases. This is especially true for charge scaling D/A signal convertors considering that, for matching purposes, all capacitors must be integral sums of a unit capacitor.

For example, for a 10-bit digital input code, a voltage scaling D/A signal convertor would require a series string of 1024 unit resistors. Similarly, for the same 10-bit digital input code, a charge scaling D/A signal convertor would require a most significant bit (MSB) capacitor made from 512 unit capacitors connected in parallel.

One way to overcome this problem is to combine voltage scaling and charge scaling principles. With combined voltage and charge scaling architecture, an (N+K)-bit digital input signal is converted to a partial analog output signal by a series string of $2^N$ resistors connected between a reference voltage and ground such that the available resistor segments are sufficient to generate all of the required output voltages for the N most significant bits of the digital input code.

Thereafter, switches attach an array of $2^K$ binary weighted capacitors between the top and bottom of the previously selected resistor segment. The K least significant bits (LSB) of the digital input code are then applied to the capacitor array to produce a complete analog output signal. In this manner, an (N+K)-bit D/A signal conversion is performed.

Since the resistor string is inherently monotonic, the capacitor array must be ratio-accurate to only K-bits for the combined voltage and charge scaling D/A signal convertor to achieve monotonicity. More importantly, by combining voltage and charge scaling principles, the sizes of the resistor string and capacitor array are significantly reduced. More specifically, only a $2^N$ resistor string and a $2^K$ capacitor array are required, rather than a $2^{(N+K)}$ resistor string or capacitor array individually.

Despite their advantages, combined voltage and charge scaling D/A signal convertors still suffer from significant problems. More specifically, the time required to charge a capacitive load at the output point limits the speed of a combined voltage and charge scaling D/A signal convertor. This becomes problematic as the speed requirement for the combined voltage and charge scaling D/A signal convertor increases.

Moreover, as with charge scaling D/A signal convertors, combined voltage and charge scaling D/A convertors must employ an operational amplifier, configured as a voltage follower buffer, at the analog signal output. Once again, as speed requirement increases, the size and power consumption requirements of the output buffer also increase. An example of a combined voltage and charge scaling D/A signal convertor that suffers from these problems can be found in U.S. Pat. No. 4,366,439 issued to Yamakido.

Thus, an improved D/A signal convertor would utilize the combined principles of voltage and charge scaling while simultaneously reducing the time necessary for charging a capacitive load. Such an improved D/A signal convertor would also reduce the size and/or power consumption requirements of the accompanying output buffer.

DISCLOSURE OF INVENTION

According to the present invention, a digital to analog (D/A) signal convertor for converting an (N+K)-bit digital input signal to an analog output signal for use in conjunction with a capacitive load is provided. The D/A signal convertor comprises first convertor means for converting an N-bit digital input signal to first and second partial analog output signals, and second convertor means for converting the first and second partial analog output signals and a K-bit digital input signal to a complete analog output signal. The D/A signal convertor further comprises signal conditioner means for converting the complete analog output signal to a final analog output signal, and switch means for first applying the first partial analog output signal and then applying the final analog output signal to the capacitive load.

According to the present invention, a method for converting an (N+K)-bit digital input signal to an analog output signal for use in conjunction with a capacitive load is also provided. The method comprises converting an N-bit digital input signal to first and second partial analog output signals, converting first and second partial analog output signals and a K-bit digital input signal to a complete analog output signal, and converting the complete analog output signal to a final analog output signal. The method further comprises applying the first partial analog output signal to the capacitive load, and applying the final analog output signal to the capacitive load.

Accordingly, it is the principle object of the present invention to provide a circuit and method for converting a digital input signal into an analog output signal for use in conjunction with a capacitive load that operates with improved speed and efficiency.

This and other objects and advantages will be readily apparent upon consideration of the following description and drawings.

BEST MODE FOR CARRYING OUT THE INVENTION

Figure 1:
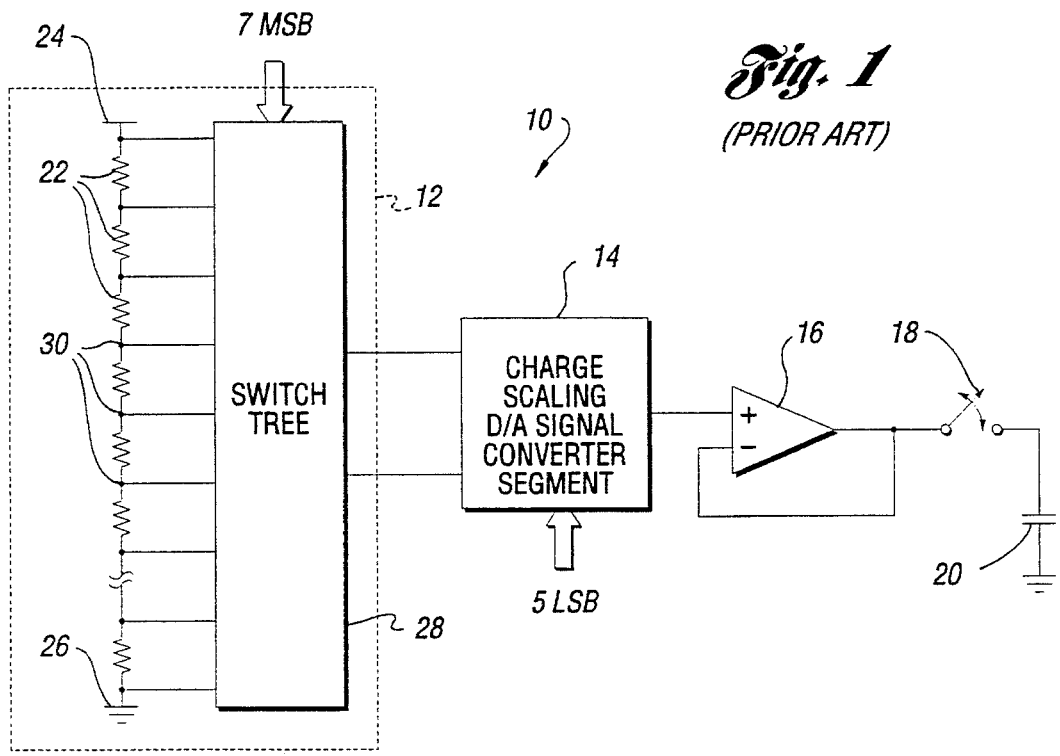
FIG. 1 is a simplified schematic of a prior art circuit for a digital to analog signal convertor.

Referring now to FIG. 1, a simplified schematic of a prior art circuit for a digital to analog (D/A) signal convertor is shown, denoted generally by reference numeral 10. The prior art D/A signal convertor 10 comprises a voltage scaling D/A signal convertor segment 12, a charge scaling D/A signal convertor segment 14, a signal buffer 16, and a switch 18. The D/A signal convertor 10 is utilized in conjunction with a capacitive load 20.

The prior art D/A signal convertor 10 of FIG. 1 is designed for converting a 12-bit digital input signal to an analog output signal. To that end, the voltage scaling D/A signal convertor segment 12 comprises a string of 128 unit resistors 22 connected in series between a reference voltage 24 and ground 26. The voltage scaling D/A signal convertor segment 12 also comprises a switch tree 28 in electrical communication with the series string of unit resistors 22.

The switch tree 28 itself comprises 129 transistors (not shown) to which the seven most significant bits (MSB) of the 12-bit digital input code are applied. Due to their low input current requirements and excellent analog switch qualities, the transistors of the switch tree 28 are preferably MOS transistors.

As is well known in the art, a seven bit binary number may take any one of $2^7$ or 128 possible combinations. Depending on the specific combination of the seven most significant bits of the 12-bit digital input code applied to the switch tree 28, a different segment of the series string of 128 unit resistors 22 is selected by the appropriate 129 MOS transistors. In that regard, the seven most significant bits select two of the 129 transistors by way of a conventional digital decoder (not shown).

The segment of the series string of unit resistors 22 selected is that segment necessary to produce a pair of tap voltages 30 (at the top and bottom of the resistor segment) sufficient to represent the specific combination of the seven most significant bits of the 12-bit digital input signal. In that regard, the 128 tap voltages 30 are each a different fractional value of the reference voltage 24 and represent partial analog output signals.

More specifically, the tap voltage 30 at the top of the resistor segment represents a first partial analog output signal, and the tap voltage 30 at the bottom of the resistor segment represents a second partial analog output signal. The voltage scaling D/A signal convertor segment 12 thus serves as first convertor means for converting the seven most significant bits of the 12-bit digital input signal to first and second partial analog output signals.

The voltage scaling D/A signal convertor segment 12 is in electrical communication with the charge scaling D/A signal convertor segment 14.

The charge scaling D/A signal convertor segment 14 comprises an array of 32 unit capacitors (not shown), and a plurality of transistors (not shown) in electrical communication with the capacitor array to which the five least significant bits (LSB) of the 12-bit digital input signal are applied.

The plurality of transistors of the charge scaling D/A signal convertor segment 14 serve to switch the capacitor array and the individual capacitors between the two tap voltages 30 previously selected by the voltage scaling D/A signal convertor segment 12. Once again, due to their low input current requirements and excellent analog switch qualities, the plurality of transistors of the charge scaling D/A signal convertor segment 14 are preferably MOS transistors.

As is also well known in the art, a five bit binary number may take any one of $2^5$ or 32 possible combinations. Depending on the specific combination of the five least significant bits of the 12-bit digital input code applied to the plurality of switches of the charge scaling D/A signal convertor segment 14, a different group of capacitors from the capacitor array of the charge scaling D/A signal convertor segment 14 is selected.

The group of capacitors selected is that group necessary to produce an output voltage sufficient to represent the specific combination of the five least significant bits of the 12-bit digital input signal. In this manner, the pair of tap voltages 30 representing the first and second partial analog output signals previously selected by the voltage scaling D/A signal convertor segment 12 are further scaled to produce a complete analog output signal. The charge scaling D/A signal convertor segment 14 thus serves as second convertor means for converting the first and second partial analog output signals of the voltage scaling D/A signal convertor segment 12 and the five least significant bits of the 12-bit digital input signal to a complete analog output signal.

Still referring to FIG. 1, the charge scaling D/A signal convertor segment 14 of the prior art D/A signal convertor 10 is in electrical communication with a signal buffer 16. The signal buffer 16 is preferably an operational amplifier configured as a voltage follower buffer for buffering the complete analog output signal of the charge scaling D/A signal convertor segment 14 and for providing a high impedance to prevent loading of the charge scaling D/A signal convertor segment 14. The signal buffer 16 thus serves as signal conditioner means for converting the complete analog output signal of the charge scaling D/A signal convertor segment 14 to a final analog output signal.

Finally, the signal buffer 16 is in electrical communication with a switch 18 for selectively connecting the signal buffer 16 to the capacitive load 20. In such a fashion, the final analog output signal is selectively transmitted to the capacitive load 20. Once again, the switch 18 is preferably a MOS transistor.

Figure 2:
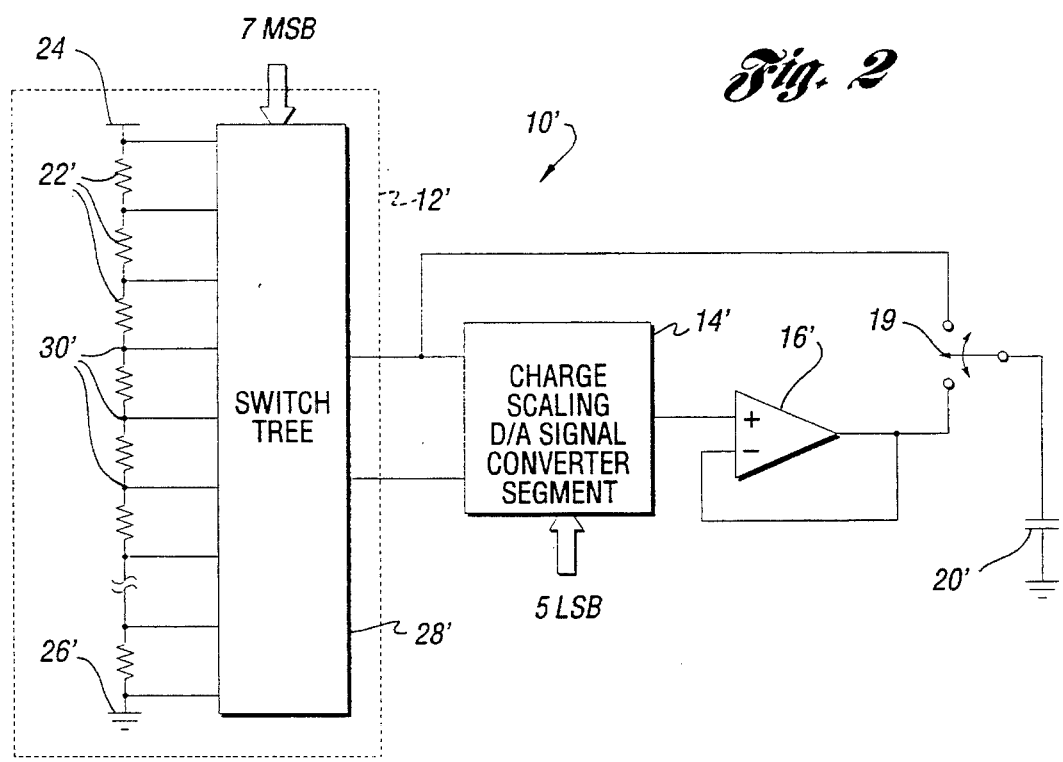
FIG. 2 is a simplified schematic of the circuit for the digital to analog signal convertor of the present invention.

Referring now to FIG. 2, a simplified schematic of the circuit for the D/A signal convertor of the present invention is shown, denoted generally by reference numeral 10'. As with the prior art D/A signal convertor 10, the D/A signal convertor 10' of the present invention comprises a voltage scaling D/A signal convertor segment 12', a charge scaling D/A signal convertor segment 14', a signal buffer 16', and a switch 19. The D/A signal convertor 10' is also utilized in conjunction with a capacitive load 20'.

The voltage scaling D/A signal convertor segment 12', charge scaling D/A signal convertor segment 14', and signal buffer 16' of the D/A signal convertor 10' of the present invention are configured and function just as their counterparts in the prior art D/A signal convertor 10. However, with respect to the switch 19, an important distinction exists between the D/A signal convertor 10' of the present invention and the prior art D/A signal convertor 10.

In that regard, the switch 19 of the D/A signal convertor 10' of the present invention does not function solely to selectively connect the final analog output signal of the signal buffer 16' to the capacitive load 20'. Instead, the switch 19 is also in electrical communication with the voltage scaling D/A signal convertor segment 12'. More specifically, the switch 19 also selectively connects the capacitive load 20' to one of the previously selected tap voltages 30. Preferably, the switch 19 selectively connects the capacitive load 20' to the tap voltage 30 at the top of the resistor segment, representing the first partial analog output signal.

The switch 19 of the D/A signal convertor 10' of the present invention preferably comprises two MOS transistors. While such a dual transistor configuration is preferable, it is readily apparent to those of ordinary skill in the art that more than two transistors could also be configured to perform these same functions.

Via the switch 19, the capacitive load 20' is first connected to the first partial analog output signal of the voltage scaling D/A signal convertor segment 12'. Thereafter, the switch 19 switches the capacitive load from electrical communication with the first partial analog output signal of the voltage scaling D/A signal convertor segment 12' to electrical communication with the final analog output signal of the signal buffer 16'. The switch 19 thus serves as switch means for first+applying the first partial analog output signal of the voltage scaling D/A signal convertor segment 12' to the capacitive load 20', and then applying the final analog output signal of the signal buffer 16' to the capacitive load 20'.

In such a manner, the capacitive load 20' is pre-charged to the voltage level of the first partial analog output signal of the voltage scaling D/A signal convertor segment 12'. Such pre-charging reduces the time then necessary for charging the capacitive load 20' to the voltage level of the final analog output signal of the signal buffer 16'. As a result, the D/A signal convertor 10' of the present invention provides improved speed in D/A signal conversion.

Moreover, the switch 19 of the D/A signal convertor 10' of the present invention allows the operational amplifier that comprises the signal buffer 16' to be smaller and/or to consume less power. As a result, the D/A signal convertor 10' of the present invention provides improved efficiency in D/A signal conversion.

Figure 3:
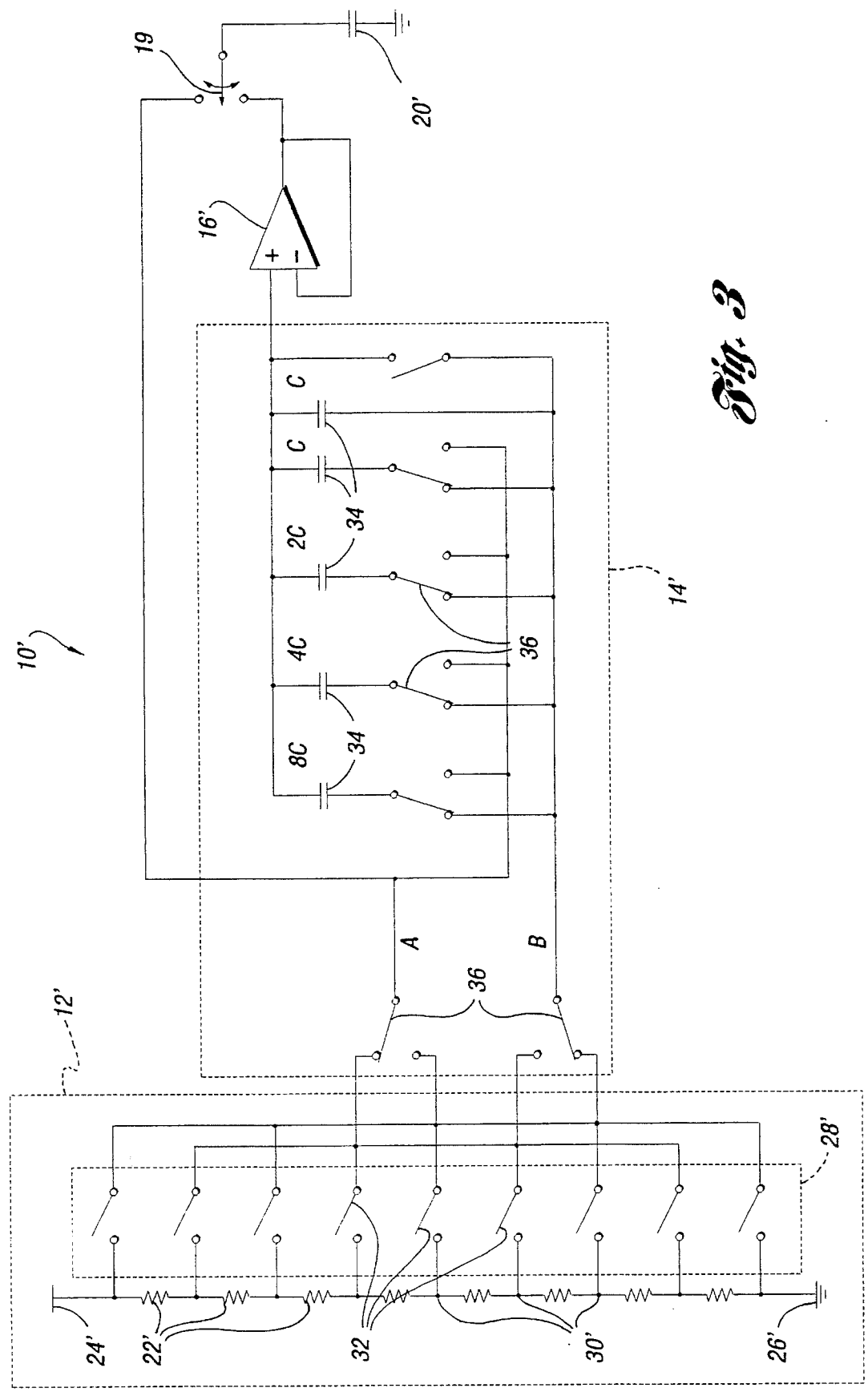
FIG. 3 is a more detailed schematic of the circuit for the digital to analog signal convertor of the present invention.

Referring now to FIG. 3, a more detailed schematic of the circuit for the D/A signal convertor 10' of the present invention is shown. As seen therein, the D/A signal convertor 10' again comprises a voltage scaling D/A signal convertor segment 12', a charge scaling D/A signal convertor segment 14', a signal buffer 16', and a switch 19. The D/A signal convertor 10' of FIG. 3 is also utilized in conjunction with a capacitive load 20'.

For simplification, the D/A signal convertor 10' of FIG. 3 is configured for converting a seven bit digital input signal to an analog output signal. To that end, the voltage scaling D/A signal convertor segment 12' comprises a string of eight unit resistors 22' connected in series between a reference voltage 24' and ground 26'. The voltage scaling D/A signal convertor segment 12' also comprises a switch tree 28' in electrical communication with the series string of unit resistors 22'. The switch tree 28' itself comprises nine MOS transistor switches 32 to which the three most significant bits of the seven bit digital input code are applied. In that regard, the three most significant bits select two of the nine transistors by way of a conventional digital decoder. As previously described, the voltage scaling D/A signal convertor segment 12' converts the three most significant bits of the seven bit digital input signal to first and second partial analog output signals.

The voltage scaling D/A signal convertor segment 12' is in electrical communication with the charge scaling D/A signal convertor segment 14'. The charge scaling D/A signal convertor segment 14' comprises an array of 16 unit capacitors 34, and a plurality of transistors 36 in electrical communication with the capacitor array to which the four least significant bits of the seven bit digital input signal are applied. Once again, as previously described, the charge scaling D/A signal convertor segment 14' converts the first and second partial analog output signals of the voltage scaling D/A signal convertor segment 12' and the four least significant bits of the seven bit digital input signal to a complete analog output signal.

Still referring to FIG. 3, the charge scaling D/A signal convertor segment 14' of the D/A signal convertor 10' of the present invention is in electrical communication with an operational amplifier signal buffer 16'. The signal buffer 16' converts the complete analog output signal of the charge scaling D/A signal convertor segment 14' to a final analog output signal.

The signal buffer 16' of the D/A signal convertor 10' of the present invention is in electrical communication with switch 19 to selectively connect the capacitive load 20' to the final analog output signal of the signal buffer 16'. The switch 19 is also in electrical communication with the voltage scaling D/A signal convertor segment 12' to selectively connect the capacitive load 20' to the first partial analog output signal.

As previously described, the switch 19 first pre-charges the capacitive load 20' by connecting it to the first partial analog output signal of the voltage scaling D/A signal convertor segment 12'. The switch 19 then connects the capacitive load 20' to the final analog output signal of the signal buffer 16'. In so doing, the D/A signal convertor 10' of the present invention provides for D/A signal conversion having improved speed and efficiency.

Figure 4:
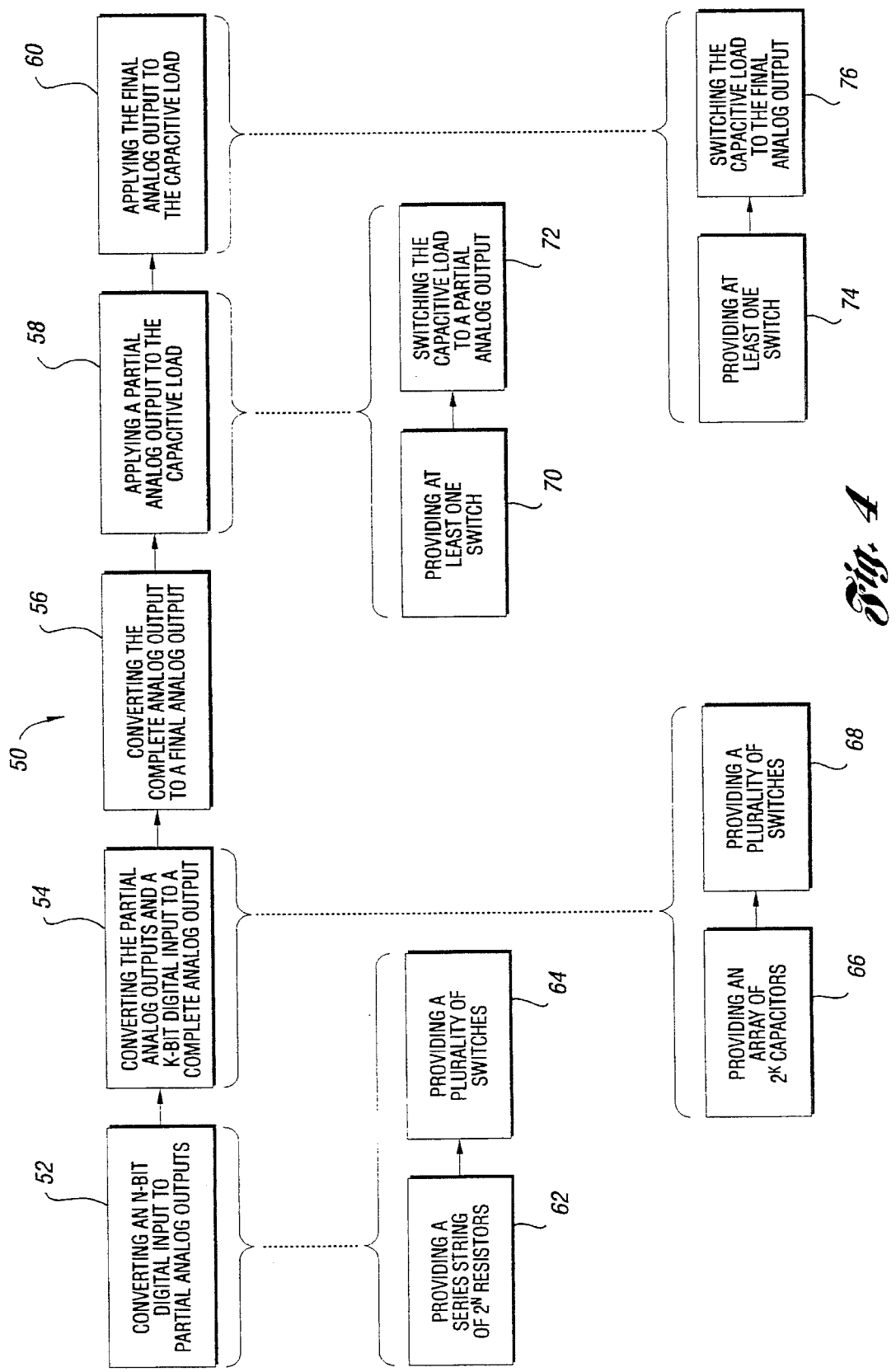
FIG. 4 is block diagram of the method for digital to analog signal conversion of the present invention.

Referring finally to FIG. 4, the method for D/A signal conversion of the present invention is shown in block diagram form, denoted generally by reference numeral 50. According to the present invention, the method 50 provides for converting an (N+K)-bit digital input signal to an analog output signal for use in conjunction with a capacitive load.

As seen in FIG. 4, the method 50 comprises converting 52 an N-bit digital input signal to first and second partial analog output signals, converting 54 the first and second partial analog output signals and a K-bit digital input signal to a complete analog output signal, and converting 56 the complete analog output signal to a final analog output signal. The method 50 further comprises applying 58 the first partial analog output signal to the capacitive load, and applying 60 the final analog output signal to the capacitive load.

According to the method 50 of the present invention, converting 52 an N-bit digital input signal to first and second partial analog output signals itself comprises providing 62 a series string of $2^N$ resistors connected between a reference voltage and ground for scaling the N-bit digital input signal, and providing 64 a plurality of switches to apply the N-bit digital input signal to the $2^N$ resistors to obtain the first and second partial analog output signals. Similarly, converting 54 the first and second partial analog output signals and a K-bit digital input signal to a complete analog output signal itself comprises providing 66 a parallel array of $2^K$ capacitors for scaling a K-bit digital input signal, and providing 68 a plurality of switches to apply the first and second partial analog output signals and the K-bit digital input signal to the $2^K$ capacitors to obtain the complete analog output signal.

Still referring to FIG. 4, applying 58 the first partial analog output signal to the capacitive load itself comprises providing 70 at least one switch in electrical communication with the capacitive load, and switching 72 the capacitive load from electrical isolation to electrical communication with the first partial analog output signal. Similarly, applying 60 the final analog output signal to the capacitive load itself comprises providing 74 at least one switch in electrical communication with the capacitive load, and switching 76 the capacitive load from electrical communication with the first partial analog output signal to electrical communication with the final analog output signal.

The circuit 10' and method 50 of the present invention have been described and shown herein in conjunction with conversion of a 12-bit digital input signal to an analog output signal. However, it should be readily apparent that the circuit 10' and method 50 of the present invention are suitable for use in any application wherein D/A signal conversion may be required, regardless of the number of bits making up the digital input signal.

It is to be understood that the present invention has been described in an illustrative manner and the terminology which has been used is intended to be in the nature of words of description rather than of limitation. Obviously, many modifications and variations of the present invention are possible in light of the above teachings. Therefore, it is also to be understood that, within the scope of the following claims, the invention may be practiced otherwise than as specifically described.

I claim:

1. A digital to analog (D/A) signal convertor for converting an (N+K)-bit digital input signal to an analog output signal, the output signal for use in conjunction with a capacitive load, the convertor comprising:

first convertor means for converting an N-bit digital input signal to first and second partial analog output signals;

second convertor means for converting the first and second partial analog output signals and a K-bit digital input signal to a complete analog output signal;

signal conditioner means for converting the complete analog output signal to a final analog output signal; and switch means for first applying the first partial analog output signal to the capacitive load and then applying the final analog output signal to the capacitive load.

2. The D/A signal convertor of claim 1 wherein the first convertor means comprises a voltage scaling D/A signal convertor segment.

3. The D/A signal convertor of claim 1 wherein the second convertor means comprises a charge scaling D/A signal convertor segment.

4. The D/A signal convertor of claim 1 wherein the signal conditioner means comprises a signal buffer.

5. The D/A signal convertor of claim 1 wherein the switch means comprises at least two transistors.

6. The D/A signal convertor of claim 2 wherein the voltage scaling D/A signal convertor segment comprises:

a series string of $2^N$ resistors connected between a reference voltage and ground for scaling an N-bit digital input signal; and a plurality of switches for applying the N-bit digital input signal to the $2^N$ resistors to obtain the first and second partial analog output signals.

7. The D/A signal convertor of claim 3 wherein the charge scaling D/A signal convertor segment comprises:

an array of $2^K$ capacitors for scaling a K-bit digital input signal; and a plurality of switches for applying the first and second partial analog output signals and the K-bit digital input signal to the $2^K$ capacitors to obtain the complete analog output signal.

8. The D/A signal convertor of claim 4 wherein the signal buffer comprises an operational amplifier.

9. The D/A signal convertor of claim 5 wherein the at least two transistors are MOS transistors.

10. The D/A signal convertor of claim 6 wherein the plurality of switches comprise transistors.

11. The D/A signal convertor of claim 7 wherein the plurality of switches comprise transistors.

12. The D/A signal convertor of claim 10 wherein the transistors are MOS transistors.

13. The D/A signal convertor of claim 11 wherein the transistors are MOS transistors.

14. A digital to analog (D/A) signal convertor for use in conjunction with a capacitive load, the D/A signal convertor comprising:

a voltage scaling D/A signal convertor segment having first and second partial analog output signals;

a charge scaling D/A signal convertor segment in electrical communication with the voltage scaling D/A signal convertor segment;

a signal buffer in electrical communication with the charge scaling D/A signal convertor segment, the signal buffer having a final analog output signal; and switch means in electrical communication with the capacitive load and the voltage scaling D/A signal convertor segment for switching the capacitive load from electrical communication with the first partial analog output signal of the voltage scaling D/A signal convertor segment to electrical communication with the final analog output signal of the signal buffer.

15. A method for converting an (N+K)-bit digital input signal to an analog output signal for use in conjunction with a capacitive load, the method comprising:

converting an N-bit digital input signal to first and second partial analog output signals;

converting the first and second partial analog output signals and a K-bit digital input signal to a complete analog output signal;

converting the complete analog output signal to a final analog output signal;

applying the first partial analog output signal to the capacitive load; and applying the final analog output signal to the capacitive load.

16. The method of claim 15 wherein converting an N-bit digital input signal to first and second partial analog output signals comprises:

providing a series string of $2^N$ resistors connected between a reference voltage and ground for scaling the N-bit digital-input signal; and providing a plurality of switches to apply the N-bit digital input signal to the $2^N$ resistors to obtain the first and second partial analog output signals.

17. The method of claim 15 wherein converting the first and second partial analog output signals and a K-bit digital input signal to a complete analog output signal comprises:

providing an array of $2^K$ capacitors for scaling a K-bit digital input signal; and providing a plurality of switches to apply the first and second partial analog output signals and the K-bit digital input signal to the $2^K$ capacitors to obtain the complete analog output signal.

18. The method of claim 15 wherein applying the first partial analog output signal to the capacitive load comprises:

providing at least one switch in electrical communication with the capacitive load; and switching the capacitive load from electrical isolation to electrical communication with the first partial analog output signal.

19. The method of claim 15 wherein applying the final analog output signal to the capacitive load comprises:

providing at least one switch in electrical communication with the capacitive load; and switching the capacitive load from electrical communication with the first partial analog output signal to electrical communication with the final analog output signal.

* * * * *